United States Patent [19]

Becher et al.

[11] Patent Number: 5,452,656
[45] Date of Patent: Sep. 26, 1995

[54] APPARATUS FOR SELECTIVELY APPLYING SOLDER PASTE TO MULTIPLE TYPES OF PRINTED CIRCUIT BOARDS

[75] Inventors: Christopher L. Becher; Richard L. Mangold, both of Boynton Beach; Douglas W. Hendricks, Boca Raton, all of Fla.

[73] Assignee: Motorola, Inc., Schaumburg, Ill.

[21] Appl. No.: 238,284

[22] Filed: May 5, 1994

Related U.S. Application Data

[62] Division of Ser. No. 918,741, Jul. 27, 1992.
[51] Int. Cl.$^6$ .............. B41F 15/08; B41F 17/00
[52] U.S. Cl. .............. 101/126; 101/44; 101/484; 101/DIG. 30; 209/939
[58] Field of Search .............. 101/43, 44, 115, 101/126, 128, 129, 233, 481, 484, 485, 486, DIG. 30, DIG. 36, DIG. 46; 209/576, 577, 587, 939; 901/47; 118/668

[56] References Cited

U.S. PATENT DOCUMENTS 4,976,356 12/1990 Mizuno et al. .............. 209/939
5,176,078 1/1993 Homma et al. .............. 101/126
5,226,361 7/1993 Grant et al. .............. 101/44

FOREIGN PATENT DOCUMENTS 25976 3/1988 European Pat. Off. .............. 101/126

Primary Examiner—Edgar S. Burr
Assistant Examiner—Stephen R. Funk
Attorney, Agent, or Firm—Kelly A. Gardner; John H. Moore; Daniel K. Nichols

[57] ABSTRACT

According to the present invention, a screen printer (200) selectively applies solder paste to multiple types of printed circuit boards. The screen printer (200) includes mobile placement equipment (210), which receives and transports the boards, and application equipment, which includes first and second stencils (225), frames for holding the stencils (225) in fixed positions, and an applicator (415) for applying solder paste to a board through either the first or second stencil (225). A controller (215) determines the type of a board received by the mobile placement equipment (210), then, when the board is of a first type, directs the mobile placement equipment (210) to a location aligned with the first stencil. When the board is of a second type, the mobile placement equipment (210) is directed to a location aligned with the second stencil.

5 Claims, 5 Drawing Sheets

APPARATUS FOR SELECTIVELY APPLYING SOLDER PASTE TO MULTIPLE TYPES OF PRINTED CIRCUIT BOARDS

This is a division, of application Ser. No. 07/918,741 filed on Jul. 27, 1992 by Becher et al. for "Method and Apparatus for Selectively Applying Solder Paste to Multiple Types of Printed Circuit Boards".

FIELD OF THE INVENTION

This invention relates in general to manufacturing equipment, and more specifically to an automated apparatus for applying solder paste to multiple types of printed circuit boards.

BACKGROUND OF THE INVENTION

With the advances in technology in recent years, many complex electronic devices have been designed and mass produced for consumption by the public. Typically, the manufacture of such an electronic device includes numerous processes, many of which are automated to increase the speed and accuracy of production.

One such automated process, typically performed by a screen printer, is the process by which a reflowable conductive paste, e.g., solder paste, is selectively applied to a printed circuit (pc) board prior to placement of components on the pc board. Conventionally, a conveyor belt shuttles the pc board first beneath a fixed camera, which records and transmits the position of the pc board to a computer, and then beneath a frame, which holds a stencil corresponding to the pc board. In response to reception of the positional information from the camera, the computer calculates alignment information, which is transmitted to a servo-motor coupled to the frame. The servo-motor thereafter makes adjustments in the x, y, and $\phi$ coordinates of the frame such that the stencil is properly aligned with the pc board. Subsequently, the properly aligned stencil is dropped into contact with the pc board, and a squeegee blade wipes across the stencil to push solder paste through openings in the stencil onto the pc board. At the completion of this process, the stencil is lifted from the pc board, which is conveyed from beneath the stencil by the conveyor belt.

As long as only one type of pc board is processed, the use of such a conventional screen printer provides for the fast and accurate application of solder paste to each pc board. If, however, a second type of pc board is to be processed, a new stencil, which corresponds to the second type of pc board, must be placed in the frame of the screen printer. Additionally, the computer must be reprogrammed with features of the second type of pc board so that the correct alignment information is transmitted to the servo-motor. Because this initializing process can be time consuming, all of one type of pc board are commonly processed at one time, subsequent to which all of another type of pc board are processed.

One solution to this problem is to place more than one screen printer on a manufacturing line that is to be used to process more than one type of pc board. In this manner, one screen printer is employed to process pc boards of a first type, e.g., decoder boards, while a second screen printer processes pc boards of a second type, e.g., receiver boards. This kind of set up, therefore, in which one screen printer processes each type of pc board, eliminates the step of initializing a screen printer each time a different type of pc board is processed. However, each type of pc board must still be processed separately to avoid the possibility of pc boards being routed to the incorrect screen printer. As a result, because only one screen printer is active at any given time, the capacity of the manufacturing line is greatly under-utilized. Furthermore, because each screen printer is usually very expensive to purchase, the cost of manufacturing the pc boards increases, resulting in a greater product cost.

Thus, what is needed is a low cost screen printer capable of randomly processing multiple types of pc boards.

SUMMARY OF THE INVENTION

A screen printer for selectively applying solder paste to multiple types of printed circuit (pc) boards includes mobile placement equipment for receiving and transporting a pc board and application equipment for selectively applying the solder paste to the pc board. The application equipment includes a first stencil, a second stencil, a frame for securing the first and second stencils in fixed positions, and an applicator for selectively applying the solder paste to the pc board through one of the first and second stencils.

A controller coupled to the mobile placement equipment determines a type of the pc board. The controller includes directing circuitry for directing the mobile placement equipment, wherein the directing circuitry directs the mobile placement equipment to a first location aligned with the first stencil in response to the determination that the pc board is of a first type. The directing circuitry directs the mobile placement equipment to a second location aligned with the second stencil in response to the determination that the pc board is of a second type. In response to a signal received from the controller, the applicator pushes the solder paste through the first stencil onto the pc board when the pc board is of the first type and through the second stencil onto the pc board when the pc board is of the second type.

DESCRIPTION OF A PREFERRED EMBODIMENT

Figure 1:
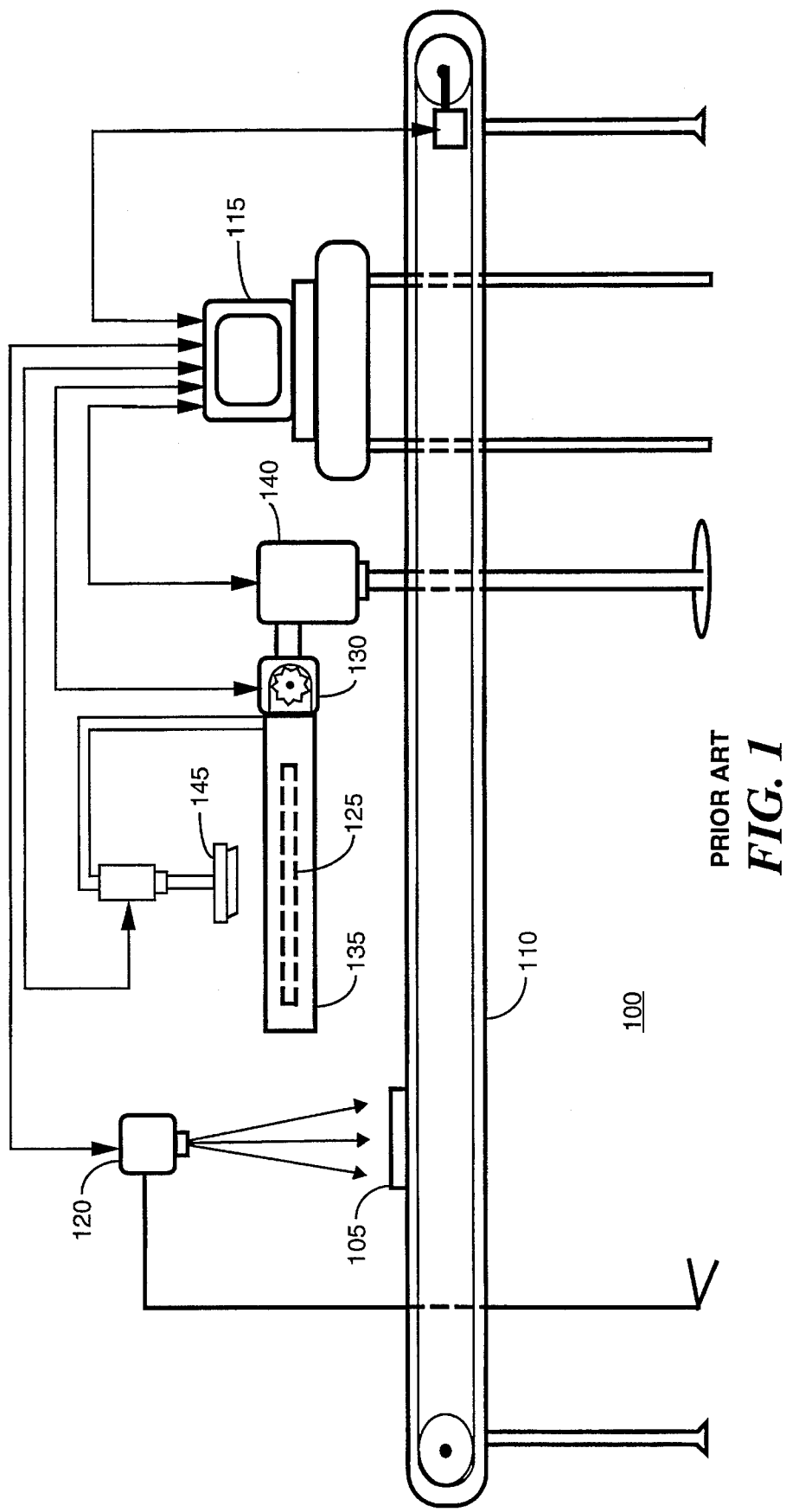
FIG. 1 is an illustration of conventional screen printing equipment for selectively applying solder paste to a printed circuit (pc) board.

With reference to FIG. 1, conventional screen printing equipment 100, i.e., a screen printer, is employed to apply solder paste to printed circuit (pc) boards. This process typically begins when a pc board 105 is placed on a conveyor belt 110, which, when directed by a control unit 115, conveys the pc board 105 to a location, as shown, beneath a fixed camera 120. The camera 120 thereafter records an image of the pc board 105 for subsequent transmission to the control unit 115. In response to reception of the recorded image, the control unit 115 directs the conveyor belt 110 to shuttle the pc board 105 to a second location beneath a solder stencil 125. The control unit 115 further calculates the exact position of the pc board 105 from pc board features shown in the recorded image and transmits an alignment signal to a servo-motor 130. In response thereto, the servo-motor 130 makes multi-axis alignment adjustments to the position of a frame 135 in which the stencil 125 is mounted. When the frame 135 is aligned correctly, a pneumatic arm 140 drops, at the direction of the control unit 115, the frame 135 until the stencil 125 contacts the pc board 105. Thereafter, a squeegee blade 145 is pneumatically lowered to wipe across the stencil 125, thereby pushing solder paste through the stencil 125 onto the pc board 105. In this manner, the solder paste is selectively applied to desired areas of the pc board 105.

Although this conventional method of applying solder paste to a pc board generally works well, only one type of pc board may be conveniently processed. If a second type of pc board is to be processed, the control unit 115 must be reprogrammed to calculate and transmit the correct alignment instructions to the stencil frame 135 in response to the different features of the pc board of the second type shown in the recorded image. Additionally, the stencil 125 corresponding to the first type of pc board must be removed from the frame 135 and replaced with a stencil corresponding to the second type of pc board. Because the initialization process, i.e., the reprogramming and replacement steps necessary to initialize the screen printing equipment 100, can become time consuming, many manufacturing lines which process more than one type of pc board utilize two or more screen printers. This type of setup, however, requires that different types of pc boards be routed to the correct screen printer. Therefore, to avoid accidental routing of a pc board to an incorrect screen printer, only one type of pc board is commonly processed at a time. As a result, while one screen printer is processing pc boards, any other screen printers remain idle. Thus, the capacity of a manufacturing line employing more than one conventional screen printer is under-utilized, resulting in increased manufacturing costs for products processed on the manufacturing line.

Figure 2:
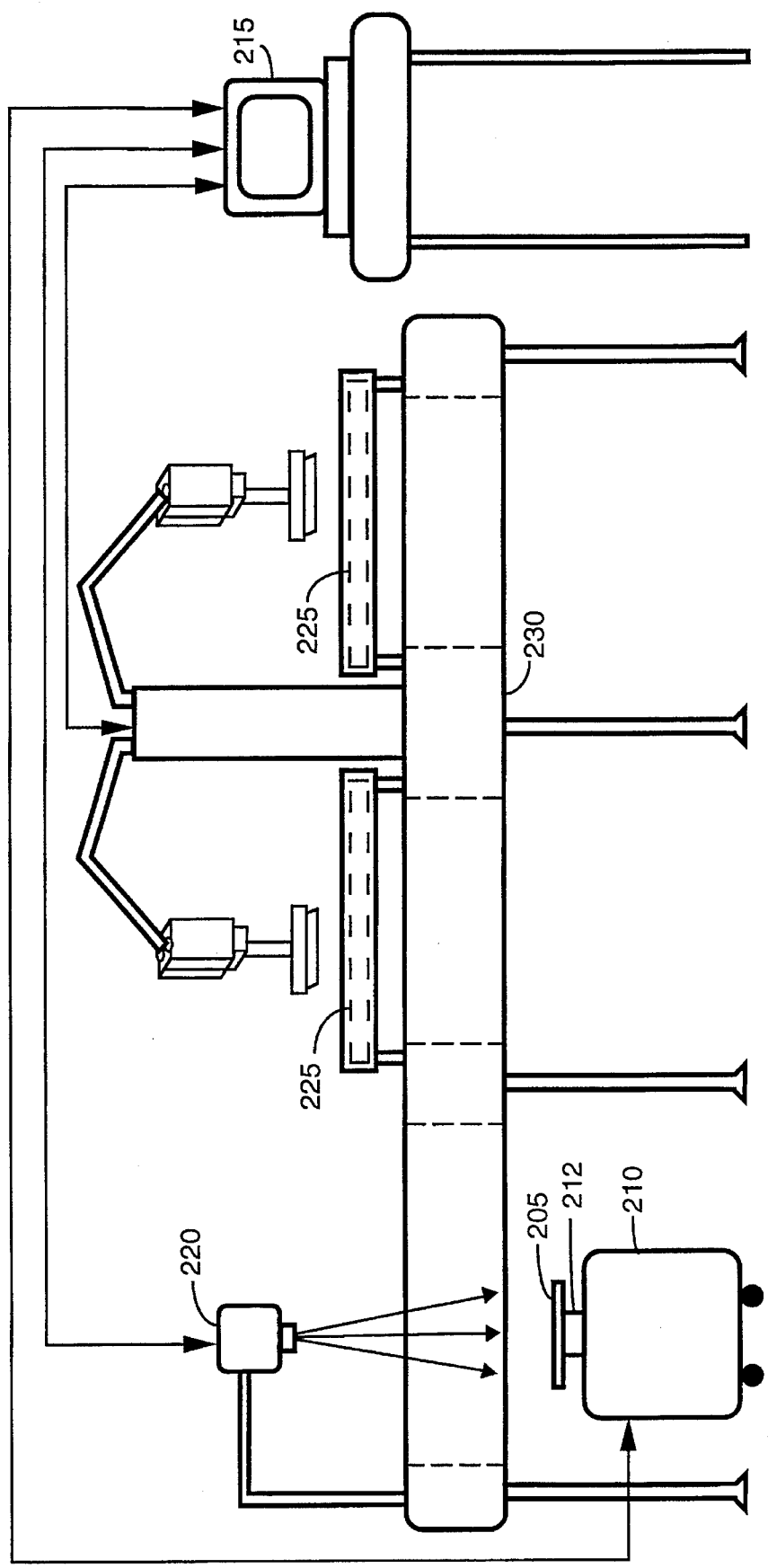
FIG. 2 is a side view of screen printing equipment, in accordance with a preferred embodiment of the present invention, for selectively applying solder paste to multiple types of pc boards.

Referring to FIG. 2, an illustration depicts the use of screen printing equipment 200, in accordance with a preferred embodiment of the present invention, to selectively apply solder paste to a pc board 205. The initial step in this process is the collection of the pc board 205 by mobile placement equipment, such as a robot 210 to which an end effector 212 is mounted. This step is performed at the direction of a control unit, e.g., a computer 215. Once the pc board 205 has been collected, the robot 210 transports the pc board 205 to a location beneath a recording device, such as a camera 220, which records an image of the pc board 205. The recorded image is thereafter transmitted to the computer 215. In response to reception of the recorded image, the computer 215 preferably compares features, such as fiducials, shape, coded information, etc., of the pc board 205 to previously programmed information. In this manner, the computer is able to identify both the type and the exact position of the pc board 205.

Alternatively, the robot 210 could initially position the pc board 205 beneath another recording device, such as a bar code reader, to decipher coded information imprinted upon the pc board 205. Such information, from which the pc board type could be identified, would be transmitted to the computer 215. Subsequently, the pc board 205 could be positioned beneath the camera 220, which, as described above, would record an image of the pc board 205 for transmission to the computer 215. The computer 215, having previously identified the type of the pc board 205, would use the features of the recorded image to determine the exact location of the pc board 205. Once the location and type of the pc board 205 are determined by the computer 215, the computer 215 transmits an alignment signal to the robot 210. The alignment signal preferably contains x, y, φ coordinates of a location to which the robot 210 is to transport the pc board 205. In accordance with the preferred embodiment of the present invention, the location is aligned beneath a stencil 225 rigidly mounted in a frame 230, as may be better understood by referring to FIG. 3.

Figure 3:
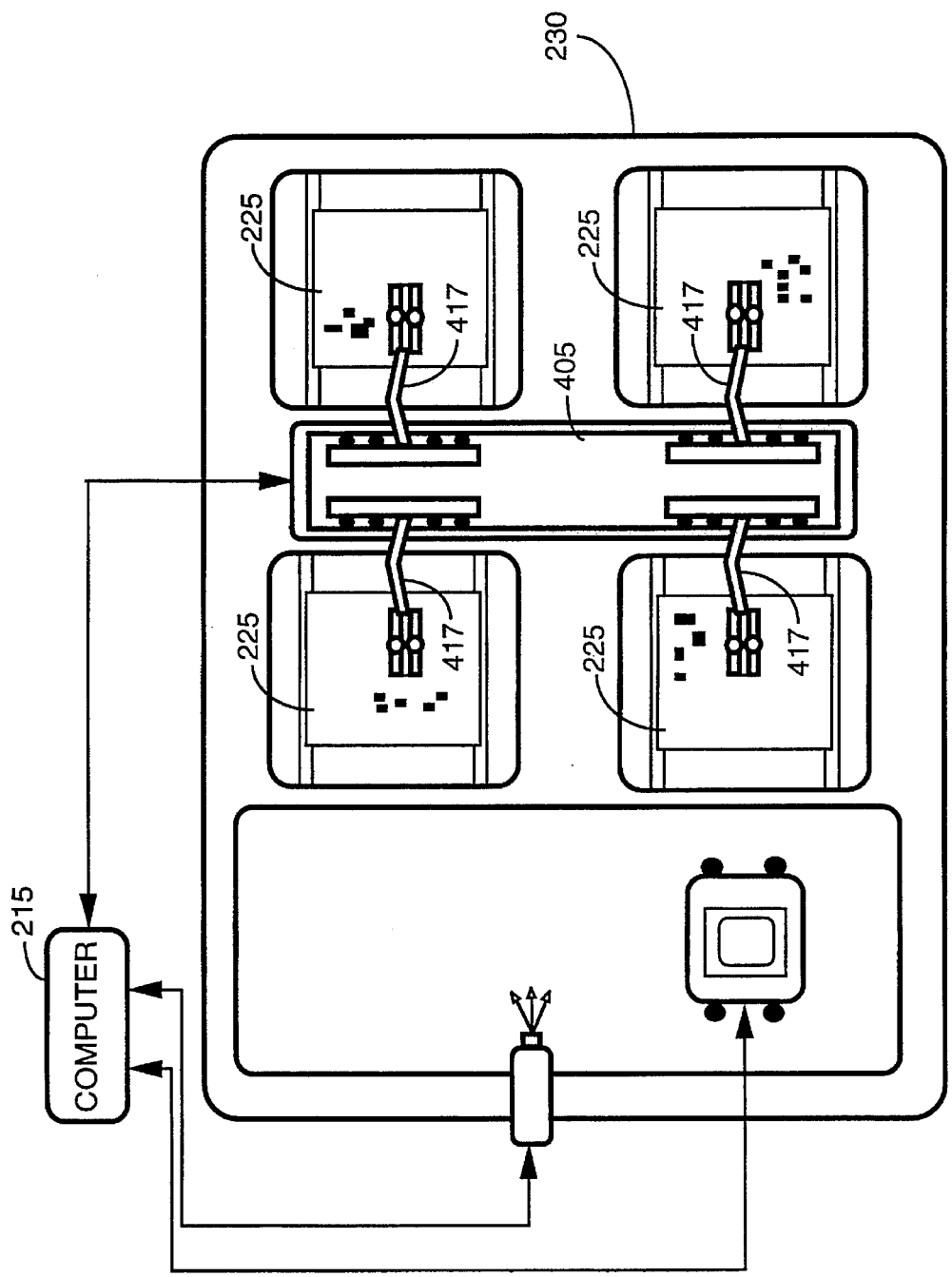
FIG. 3 is an overhead view of the screen printing equipment of FIG. 2 in accordance with the preferred embodiment of the present invention.

FIG. 3 depicts an overhead view of the screen printing equipment 200 of FIG. 2. Preferably, four stencils 225 are held in fixed positions in the frame 230, although any number of stencils 225 could theoretically be held by the frame 230. Each stencil 225, according to the present invention, has a pattern of cut-outs associated with a type of pc board. For example, a first stencil 225 could have cut-outs corresponding to component pads on a first type of pc board, while a second stencil 225 corresponds to a second type of pc board, which may be assembled to a pc board of the first type. The other two stencils 225 could correspond to different types of pc boards for use in another product. In this manner, the frame 230 of a single screen printer is employed to hold stencils 225 for more than one type of pc board, whereas the conventional screen printing equipment 100 (FIG. 1) is capable of holding only one stencil 125.

Figure 4:
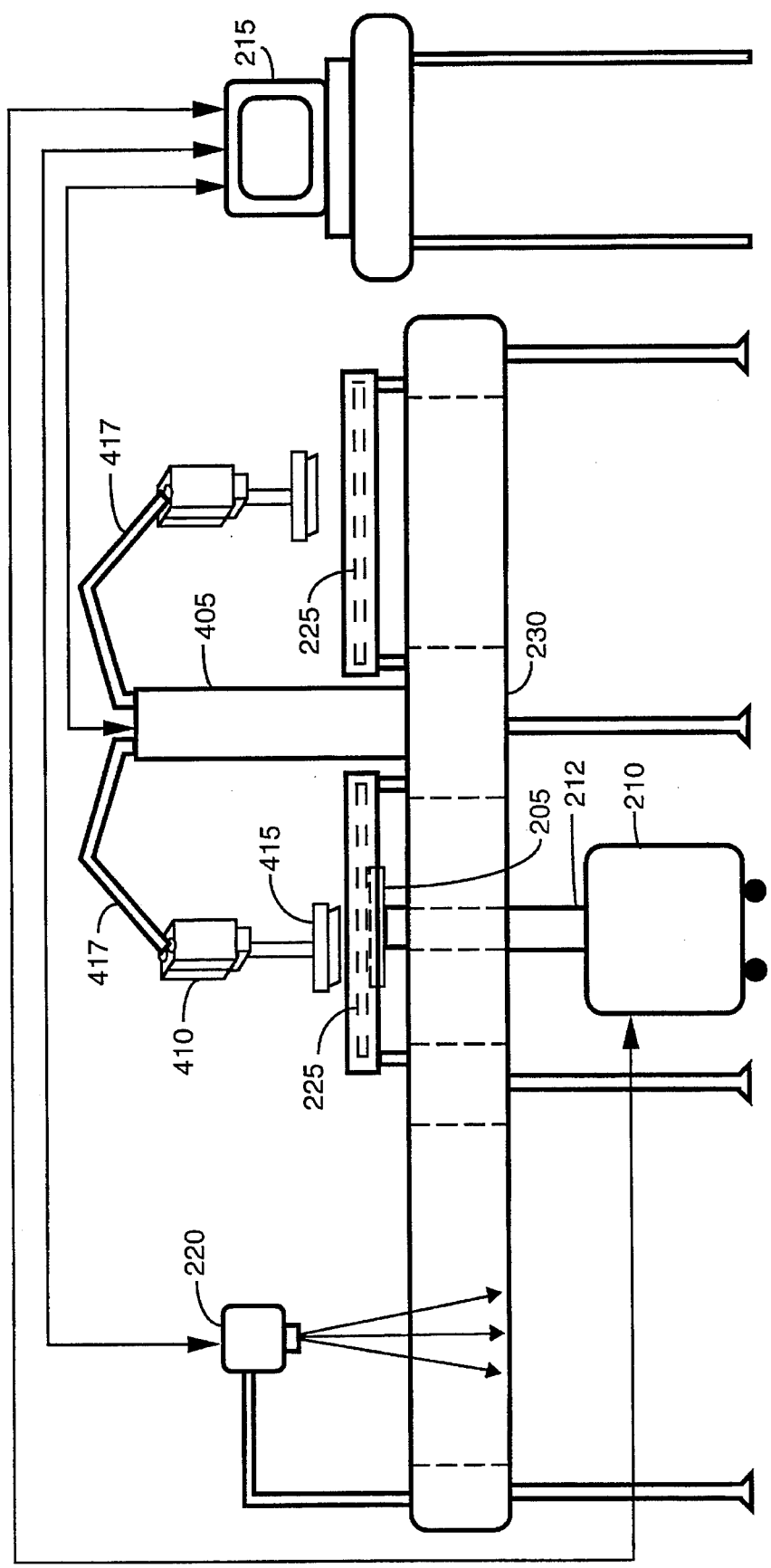
FIG. 4 is a side view of the screen printing equipment of FIG. 2, wherein mobile placement equipment has transported a pc board to a location in alignment with a stencil in accordance with the preferred embodiment of the present invention.

Referring next to FIG. 4, in response to reception of the alignment signal, the robot 210 transports the pc board 205 into x axis, y axis, and angular alignment with the proper stencil 225. The end effector 212 of the robot 210 thereafter lifts the pc board 205 into z axis alignment with the stencil 225. In this position, the pc board 205 contacts the stencil 225, as shown, such that the correct areas of the pc board 205 are aligned with the cut-outs of the stencil 225. Thereafter, the computer 215 transmits a signal to a printer drive 405, in response to which a printer head, consisting of a pneumatic stage 410, a squeegee blade 415, and a mounting arm 417, is activated by the printer drive 405. During this process, the pneumatic stage 410 lowers the squeegee blade 415 into contact with the upper surface of the stencil 225, subsequent to which the squeegee blade 415 wipes across the stencil 225, forcing solder paste through the cut-outs onto the pc board 205. After the selective application of the solder paste to the pc board 205, the end effector 212 of the robot 210 is lowered to remove the pc board 205 from contact with the stencil 225. The computer 215 subsequently directs the robot 210 to transport the pc board 205 to a next location, wherein the pc board 205 may be manually removed from the robot 210 or placed by the robot 210 on a conveyor belt for further processing.

Returning to FIG. 3, the printer drive 405 includes a dedicated printer head, i.e., pneumatic stage 410 (FIG. 4), squeegee blade 415, and mounting arm 417, for each of the four stencils 225 held in the frame 230. As described above, in response to reception of the signal sent to the printer drive 405 from the computer 215, one of the squeegee blades 415 (FIG. 4) is lowered by the corresponding pneumatic stage 410 (FIG. 4) into contact with the stencil 225. Thereafter, the corresponding mounting arm 417 is moved by the printer drive 405 such that the squeegee blade 415 wipes across the correct stencil 225.

Figure 5:
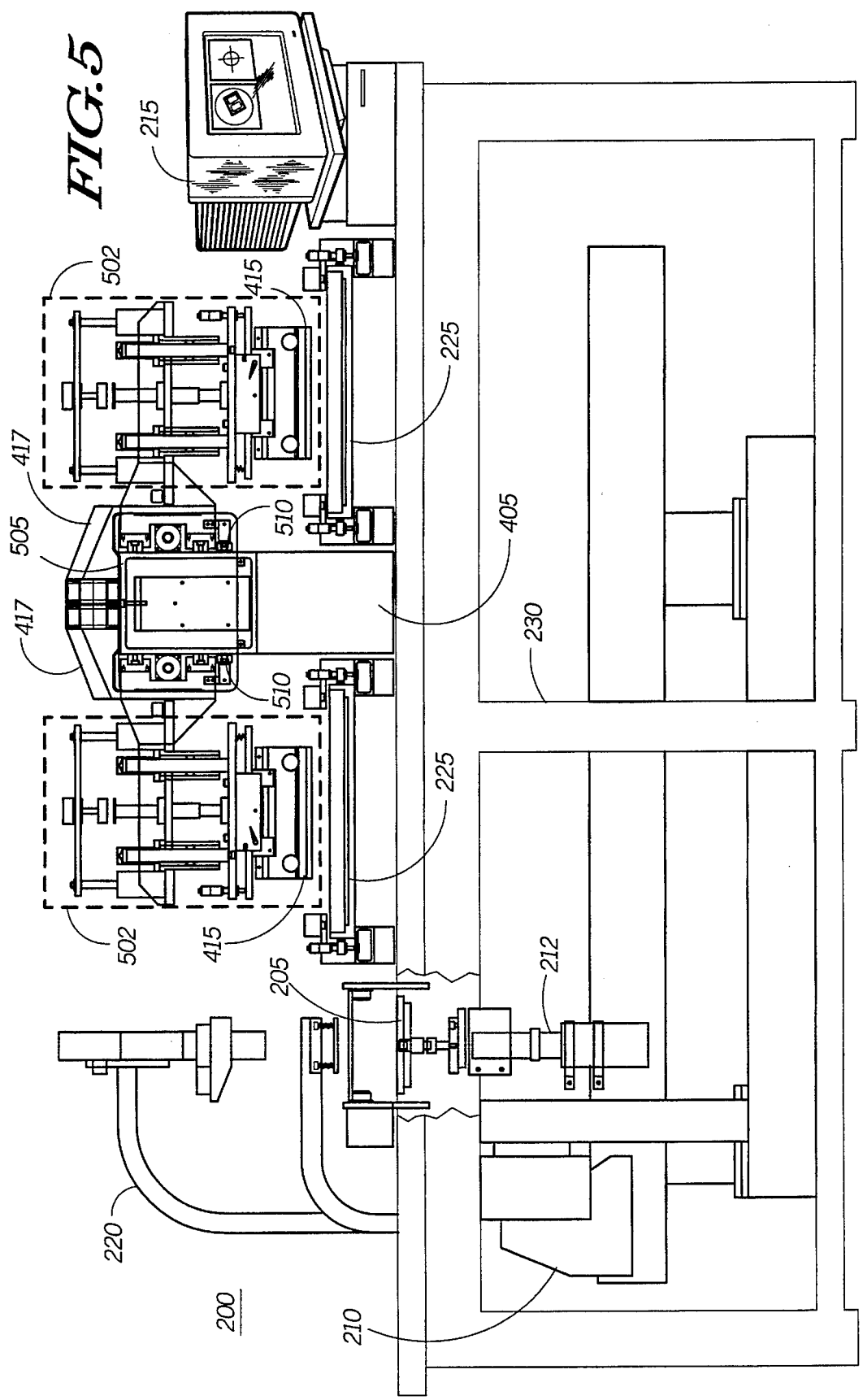
FIG. 5 is a more detailed side view of the screen printing equipment of FIG. 2 in accordance with the preferred embodiment of the present invention.

In this manner, as many as four different types of pc boards, in accordance with the preferred embodiment of the present invention, may be processed by the screen printing equipment 200. Furthermore, unlike conventional screen printers, the screen printing equipment 200 does not need to be re-initialized between processing the different types of pc boards because the computer 215 is programmed to recognize the type of each pc board 205 at the time of processing. Therefore, the screen printing equipment 200 according to the present invention may conveniently process the different types of pc boards in a random order. Referring next to FIG. 5, an illustration depicts a more detailed side view of the screen printing equipment 200. As described above, the computer 215, preferably an Apple Macintosh IIfx, manufactured by Apple Computer, Inc. of Cupertino, Calif., is coupled to and directs a robot 210. In accordance with the preferred embodiment of the present invention, the robot 210 is a Seiko XM5106, manufactured by Seiko Instruments U.S.A., Inc. of Torrance, Calif., with the z axis mounted upside down. As shown, the robot 210 is mounted within the frame 230 of the screen printing equipment 200 such that the end effector 212 is able to extend several inches to reach the stencils 225.

The frame 230 is preferably formed from stainless steel, although aluminum or other such materials are also acceptable. According to the present invention, the frame 230, and the stencils 225 held by the frame 230, are mounted high enough so that the robot 210 may travel unimpeded beneath the frame 230. The camera 220, also mounted to the frame 230, is set in a plane above that in which the robot travels. In accordance with the preferred embodiment of the present invention, the camera 220 is a charge coupled recording device, such as that manufactured by Pulnix America, Inc. of Sunnyvale, Calif. The camera 220 should have a high enough resolution such that small distinguishing features, such as fiducials, of the pc board 205 are recognizable by the computer 215.

Additionally, the printer drive 405, also constructed from stainless steel, is mounted to the frame 230, as shown. The printer heads 502, one dedicated for use with each stencil 225, are secured to the printer drive 405 by the mounting arms 417, which are preferably set in a track 505 provided therefor in the printer drive 405. The track 505 also allows for the movement of the printer heads 502, and thus provide for the wiping motion of the squeegee blades 415 across the stencils 225. According to the present invention, the movement of each of the printer heads 502 in the track 505 of the printer drive 405 is controlled by a separate stepper motor 510. In accordance with an alternate embodiment of the present invention, however, a single stepper motor 510 may drive two printer heads 502, with magnetic clutches determining which printer head 502 is activated, although this embodiment typically requires greater maintenance of the printer drive 405.

In summary, utilization of the above described equipment, in accordance with the preferred embodiment of the present invention, provides for a screen printer capable of processing multiple types of pc boards. Furthermore, because the screen printer can be programmed to recognize different pc board types, and can hold several different stencils corresponding to the pc board types, the screen printer does not have to be re-initialized each time a different type of pc board is processed. This provides a major advantage over conventional screen printers, in which the stencil must be replaced and the computer reprogrammed each time a different type of pc board is processed.

Additionally, in accordance with the preferred embodiment of the present invention, the screen printer recognizes the type of each pc board at the time of processing. Therefore, in response to recognizing that a pc board is of a specific type, the control unit of the screen printer may direct the robot to align the pc board with one of the stencils held by the screen printer. In this manner, multiple types of pc boards may be processed randomly. When, for example, a radio receiver is manufactured, a decoder board used in the radio receiver may be collected by the robot, recognized by the screen printer, and aligned with a decoder stencil, subsequent to which solder paste is applied to the decoder board. Immediately thereafter, a receiver board used in the radio receiver may be collected, recognized, and aligned with a receiver stencil, subsequent to which a further decoder board, or a pc board of another type, may be processed. This process could become time consuming in a conventional screen printer, which would have to be re-initialized between processing each receiver and decoder board.

A further feature of the present invention is the reduced cost of the screen printer when compared to the expense involved in having two or more conventional screen printers set up on a single manufacturing line. Thus, pc boards processed by a screen printer in accordance with the preferred embodiment of the present invention may cost less to manufacture than pc boards processed on a manufacturing line having more than one conventional screen printer. This decrease in manufacturing cost may, in turn, be reflected in a lower product cost for the consumer.

It should be appreciated by now that there has been provided a low cost screen printer capable of randomly processing multiple types of pc boards.

We claim:

1. A screen printer for selectively applying solder paste to multiple types of printed circuit (pc) boards, comprising:

mobile placement equipment for receiving and transporting a pc board;

application equipment for selectively applying the solder paste to the pc board, the application equipment comprising:

a first stencil;

a second stencil;

a frame for securing the first and second stencils in fixed positions; and an applicator for selectively applying the solder paste to the pc board through one of the first and second stencils;

a controller coupled to the mobile placement equipment, the controller including means for determining a type of the pc board and including means for directing the mobile placement equipment, wherein the directing means of the controller directs the mobile placement equipment to a first location aligned with the first stencil in response to the determining means determining that the pc board is of a first type, and wherein the directing means of the controller further directs the mobile placement equipment to a second location aligned with the second stencil in response to the determining means determining that the pc board is of a second type; and wherein the applicator, in response to a signal received from the controller, pushes the solder paste through the first stencil onto the pc board when the pc board is of the first type and through the second stencil onto the pc board when the pc board is of the second type.

2. The screen printer in accordance with claim 1, further comprising recording equipment coupled to the controller for recording an image of the pc board and transmitting the recorded image of the pc board to the controller, wherein the recorded image of the pc board is utilized by the determining means of the controller in determining whether the pc board is of the first type or of the second type.

3. The screen printer in accordance with claim 2, further comprising means for activating the controller in response to reception of the recorded image from the recording equipment.

4. The screen printer in accordance with claim 1, wherein the controller comprises a computer.

5. The screen printer in accordance with claim 1, wherein the frame included in the application equipment secures four stencils.

* * * * *